US012575398B2

(12) United States Patent
Jeon et al.

(10) Patent No.: US 12,575,398 B2
(45) Date of Patent: Mar. 10, 2026

(54) INTERCONNECTION STRUCTURE AND METHOD OF FABRICATING THE SAME

(71) Applicant: Samsung Electronics Co., Ltd., Suwon-si (KR)

(72) Inventors: Yoonyoung Jeon, Suwon-si (KR); Youngmin Kim, Suwon-si (KR); Joon Seok Oh, Suwon-si (KR); Changbo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 380 days.

(21) Appl. No.: 18/307,109

(22) Filed: Apr. 26, 2023

(65) Prior Publication Data

US 2024/0047357 A1     Feb. 8, 2024

(30) Foreign Application Priority Data

Aug. 5, 2022   (KR) ........................ 10-2022-0097848
Oct. 13, 2022  (KR) ........................ 10-2022-0131834

(51) Int. Cl.
    *H01L 23/532*     (2006.01)
    *H01L 21/768*     (2006.01)
    *H01L 23/528*     (2006.01)

(52) U.S. Cl.
    CPC .. *H01L 23/53238* (2013.01); *H01L 21/76802* (2013.01); *H01L 21/76843* (2013.01); *H01L 21/76877* (2013.01); *H01L 23/528* (2013.01)

(58) Field of Classification Search
    CPC ......... H01L 23/53238; H01L 21/76802; H01L 21/76843; H01L 21/76877; H01L 23/528; H01L 23/5226; H01L 21/76849
    See application file for complete search history.

(56) References Cited

U.S. PATENT DOCUMENTS

| | | | |
|---|---|---|---|
| 10,115,668 B2 | 10/2018 | Reingruber et al. | |
| 10,373,885 B2 | 8/2019 | Yu et al. | |
| 11,075,149 B2 | 7/2021 | Lee | |
| 2021/0183756 A1 | 6/2021 | Chae et al. | |
| 2021/0375810 A1 | 12/2021 | Kim | |
| 2021/0398905 A1 | 12/2021 | Teng et al. | |
| 2022/0077066 A1 | 3/2022 | Kim et al. | |
| 2023/0062775 A1* | 3/2023 | Hsu ..................... H01L 23/5386 |

* cited by examiner

*Primary Examiner* — Julia Slutsker
(74) *Attorney, Agent, or Firm* — Wolf, Greenfield & Sacks, P.C.

(57) ABSTRACT

An interconnection structure includes a first dielectric layer, a second dielectric layer, first wiring patterns, and a first conductive pattern. The first wiring patterns respectively include a first penetration part that extends into a surface of the first dielectric layer, a first intervention part on the first penetration part and in the second dielectric layer, and a first connection part on the first intervention part and in the second dielectric layer. A top surface of the first intervention part is at a same level as a top surface of the first conductive pattern relative to the surface of the first dielectric layer. An angle between a sidewall of the first connection part and the top surface of the first intervention part is greater than that between a sidewall of the first penetration part and a bottom surface of the first dielectric layer.

20 Claims, 18 Drawing Sheets

RDL3-2
RDL3-1
} RDL3

RDL2-3
RDL2-2
} RDL2
RDL2-1

RDL1-3
RDL1-2
} RDL1
RDL1-1

INTERCONNECTION STRUCTURE AND METHOD OF FABRICATING THE SAME

CROSS-REFERENCE TO RELATED APPLICATIONS

This U.S. nonprovisional application claims priority under 35 U.S.C § 119 to Korean Patent Applications No. 10-2022-0097848 filed on Aug. 5, 2022, and No. 10-2022-0131834 filed on Oct. 13, 2022, in the Korean Intellectual Property Office, the disclosures of which are hereby incorporated by reference in their entirety.

FIELD

The present inventive concepts relate to an interconnection structure and a method of fabricating the same, and more particularly, to an interconnection structure with increased reliability and a method of fabricating the same.

BACKGROUND

Semiconductor chips are gradually becoming smaller with the continuous development of semiconductor technology. At the same time, various functions are integrated into a single semiconductor chip. Therefore, semiconductor chips may have a relatively large number of input/output pads on a small area.

A semiconductor package is provided to implement an integrated circuit chip for use in electronic products. A semiconductor package is typically configured such that a semiconductor chip is mounted on a printed circuit board and bonding wires or bumps are used to electrically connect the semiconductor chip to the printed circuit board. Various research is ongoing to improve structural stability and electrical properties without pattern abnormality.

SUMMARY

Some embodiments of the present inventive concepts provide an interconnection structure whose structural stability is improved and a method of fabricating the same.

The present inventive concepts are not limited to those mentioned above, and other aspects which have not been mentioned above will be clearly understood to those skilled in the art from the following description.

According to some embodiments of the present inventive concepts, an interconnection structure may comprise: a first dielectric layer; a second dielectric layer on a surface of the first dielectric layer; a plurality of first wiring patterns; and a first conductive pattern between the first wiring patterns. The first wiring patterns respectively comprise: a first penetration part that extends into the surface of the first dielectric layer; a first intervention part on the first penetration part and in the second dielectric layer; and a first connection part on the first intervention part and in the second dielectric layer. A top surface of the first intervention part is at a same level as a top surface of the first conductive pattern relative to the surface of the first dielectric layer, and an angle between a sidewall of the first connection part and the top surface of the first intervention part is greater than an angle between a sidewall of the first penetration part and a bottom surface of the first dielectric layer.

According to some embodiments of the present inventive concepts, an interconnection structure may comprise: a first dielectric layer; a second dielectric layer on a surface of the first dielectric layer; a plurality of first wiring patterns; and a plurality of first conductive patterns between the first wiring patterns. The first wiring patterns respectively comprise: a first penetration part that extends into the surface of the first dielectric layer; a first intervention part on the first penetration part and in the second dielectric layer; and a first connection part on the first intervention part and in the second dielectric layer. A width at a top surface of the first penetration part is different from a width at a bottom surface of the first penetration part, and a width at a top surface of the first connection part is the same as a width at a bottom surface of the first connection part.

According to some embodiments of the present inventive concepts, an interconnection structure may comprise: a first dielectric layer; a second dielectric layer on a surface of the first dielectric layer; a third dielectric layer on the second dielectric layer; a plurality of first wiring patterns; a plurality of second wiring patterns on the first wiring patterns; a plurality of first conductive patterns between the first wiring patterns; and a plurality of second conductive patterns between the second wiring patterns. The first wiring patterns respectively comprise: a first penetration part that extends into the surface of the first dielectric layer; a first intervention part on the first penetration part and in the second dielectric layer; and a first connection part on the first intervention part in the second dielectric layer. A top surface of the first intervention part is at a same level as top surfaces of the first conductive patterns relative to the surface of the first dielectric layer, and the first intervention part and the first connection part define a stepwise shape.

BRIEF DESCRIPTION OF THE DRAWINGS

FIG. 1 illustrates a cross-sectional view showing an interconnection structure according to some embodiments of the present inventive concepts.

FIG. 3 illustrates a cross-sectional view showing an interconnection structure according to some embodiments of the present inventive concepts.

FIG. 4 illustrates a cross-sectional view showing a semiconductor package including an interconnection structure according to some embodiments of the present inventive concepts.

FIG. 5 illustrates a cross-sectional view showing a semiconductor package including an interconnection structure according to some embodiments of the present inventive concepts.

DETAILED DESCRIPTION OF EMBODIMENTS

Figure 2A:
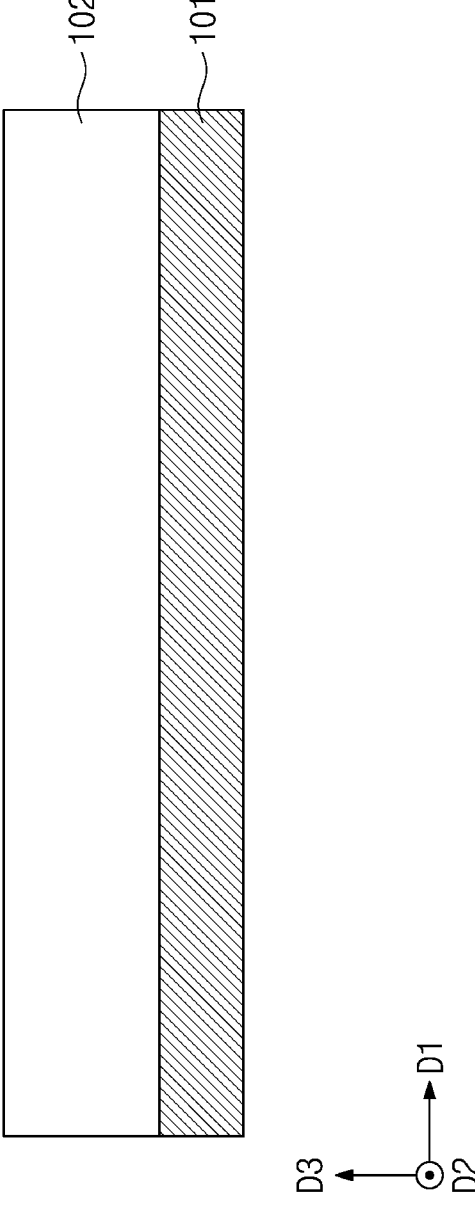
FIGS. 2A, 2B, 2C, 2D, 2E, 2F, 2G, 2H, 2I, 2J, 2K, 2L, 2M, and 2N illustrate cross-sectional views showing a method of fabricating an interconnection structure according to some embodiments of the present inventive concepts.

The following will now describe in detail an interconnection structure according to some embodiments of the present inventive concepts in conjunction with the accompanying drawings.

Figure 1:
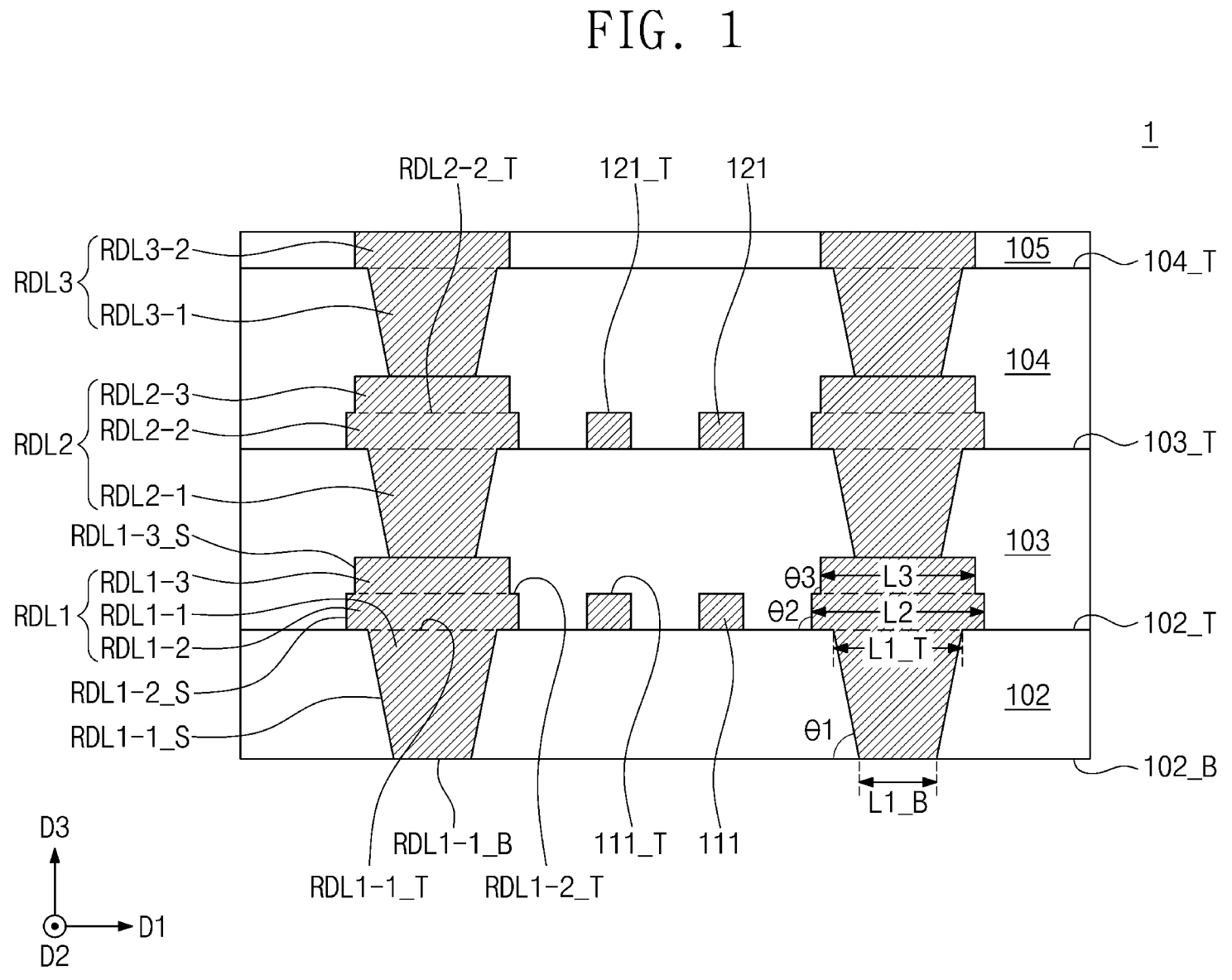

FIG. 1 illustrates a cross-sectional view showing an interconnection structure according to some embodiments of the present inventive concepts. The cross-sectional illustrations are schematic in nature, and as such, embodiments should not be construed as limited to the particular shapes of regions illustrated herein but are to include deviations in shapes that result, for example, from manufacturing.

Referring to FIG. 1, an interconnection structure 1 according to some embodiments of the present inventive concepts may include a first dielectric layer 102, a second dielectric layer 103 on the first dielectric layer 102, a third dielectric layer 104 on the second dielectric layer 103, a fourth dielectric layer 105 on the third dielectric layer 104, a first wiring pattern RDL1, a second wiring pattern RDL2 on the first wiring pattern RDL1, a third wiring pattern RDL3 on the second wiring pattern RDL2, a first conductive pattern 111, and a second conductive pattern 121. The interconnection structure 1 may have a plate shape that extends along a plane defined by a first direction D1 and a second direction D2. The first direction D1 and the second direction D2 may intersect each other. For example, the first and second directions D1 and D2 may be orthogonal to each other. The terms "first," "second," etc. are used herein merely to distinguish one element, layer, direction, etc., from another. When elements, layers, etc., are described as being "directly on" or "in direct contact" with one another, no intervening elements, layers, etc. are present.

The first, second, third, and fourth dielectric layers 102, 103, 104, and 105 may include a dielectric material, for example, a photo-imageable dielectric (PID). For example, the photo-imageable dielectric may include at least one of photosensitive polyimide, polybenzoxazole (PBO), phenolic polymers, and/or benzocyclobutene polymers. The term "and/or" includes any and all combinations of one or more of the associated listed items. The terms "comprises," "comprising," "includes" and/or "including," when used herein, specify the presence of (but do not preclude the presence or addition of) one or more other features.

The first wiring pattern RDL1 may be provided in the first dielectric layer 102 and the second dielectric layer 103. The first wiring pattern RDL1 may be provided in plural. The first wiring pattern RDL1 may include a first penetration part RDL1-1, a first intervention part RDL1-2 on the first penetration part RDL1-1, and a first connection part RDL1-3 on the first intervention part RDL1-2. The first penetration part RDL1-1, the first intervention part RDL1-2, and the first connection part RDL1-3 may be connected to constitute a single or unitary structure with no boundary therebetween.

The first penetration part RDL1-1 of the first wiring pattern RDL1 may penetrate the first dielectric layer 102. The first penetration part RDL1-1 may have an inclined sidewall RDL1-1_S. The first penetration part RDL1-1 may have a width that increases in a direction from a bottom surface RDL1-1_B thereof toward a top surface RDL1-1_T thereof.

The first intervention part RDL1-2 of the first wiring pattern RDL1 may be located in or at the same level as that of the second dielectric layer 103. The first intervention part RDL1-2 of the first wiring pattern RDL1 may have a bottom surface at the same level as that of a bottom surface of the second dielectric layer 103. The first connection part RDL1-3 of the first wiring pattern RDL1 may be located in or at the same level as that of the second dielectric layer 103. The first intervention part RDL1-2 of the first wiring pattern RDL1 may have a sidewall RDL1-2_S perpendicular to a top surface 102_T of the second dielectric layer 102.

For the first wiring pattern RDL1, the bottom surface RDL1-1_B of the first penetration part RDL1-1 may have a width L_B different from a width L1_T at the top surface RDL1-1_T of the first penetration part RDL1-1. For example, as discussed above, the width of the first penetration part RDL1-1 may increase in a direction from the bottom surface RDL1-1_B of the first penetration part RDL1-1 toward the top surface RDL1-1_T of the first penetration part RDL1-1. The first connection part RDL1-3 of the first wiring pattern RDL1 may have a width L3 less than a width L2 of the first intervention part RDL1-2 of the first wiring pattern RDL1. The width L3 of the first connection part RDL1-3 of the first wiring pattern RDL1 may be greater than the width L1_T at the top surface RDL1-1_T of the first penetration part RDL1-1. The width L3 of the first connection part RDL1-3 may be constant or substantially uniform from top toward bottom surfaces of the first connection part RDL1-3.

The first connection part RDL1-3 of the first wiring pattern RDL1 may have a sidewall RDL1-3_S perpendicular to the top surface 102_T of the second dielectric layer 102. A stepwise shape may be formed by the first intervention part RDL1-2 and the first connection part RDL1-3 of the first wiring pattern RDL1.

The first conductive pattern 111 may be provided in the second dielectric layer 103. The first conductive pattern 111 may be provided in plural. The plurality of first conductive patterns 111 may be positioned between the first wiring patterns RDL1. The first conductive patterns 111 may have their top surfaces 111_T at the same level as that of a top surface RDL1-2_T of the first intervention part RDL1-2 of the first wiring pattern RDL1. The first conductive patterns 111 may have their bottom surfaces coplanar with the top surface 102_T of the first dielectric layer 102. A distance between the top surface 111_T of the first conductive pattern 111 and a top surface 103_T of the second dielectric layer 103 may be greater than a height of the first conductive pattern 111.

An angle θ3 between the sidewall RDL1-3_S of the first connection part RDL1-3 and the top surface RDL1-2_T of the first intervention part RDL1-2 may be greater than an angle θ1 between the sidewall RDL1-1_S of the first penetration part RDL1-1 and a bottom surface 102_B of the first dielectric layer 102. In an embodiment, about 90 degrees may be given to the angle θ3 between the sidewall RDL1-3_S of the first connection part RDL1-3 and the top surface RDL1-2_T of the first intervention part RDL1-2. An angle θ2 between the sidewall RDL1-2_S of the first intervention part RDL1-2 and the top surface 102_T of the first dielectric layer 102 may be the same as the angle θ3 between the sidewall RDL1-3_S of the first connection part RDL1-3 and the top surface RDL1-2_T of the first intervention part RDL1-2.

The second wiring pattern RDL2 may be provided in the second dielectric layer 103 and the third dielectric layer 104. The second wiring pattern RDL2 may be provided in plural. The second wiring pattern RDL2 may include a second penetration part RDL2-1, a second intervention part RDL2-2 on the second penetration part RDL2-1, and a second connection part RDL2-3 on the second intervention part RDL2-2. The second penetration part RDL2-1, the second intervention part RDL2-2, and the second connection part RDL2-3 may be connected to constitute a single unitary structure with no boundary therebetween.

The second penetration part RDL2-1 of the second wiring pattern RDL2 may be located in or at the same level as that of the second dielectric layer 103. The second penetration part RDL2-1 of the second wiring pattern RDL2 may penetrate the second dielectric layer 103. The second penetration part RDL2-1 may have an inclined sidewall RDL2-1_S. The second penetration part RDL2-1 may have a width that increases in a direction from bottom toward top surfaces of the second penetration part RDL2-1.

The second intervention part RDL2-2 of the second wiring pattern RDL2 may be located in or at the same level as that of the third dielectric layer 104. The second intervention part RDL2-2 of the second wiring pattern RDL2 may have a bottom surface at the same level as that of a bottom surface of the third dielectric layer 104. The second connection part RDL2-3 of the second wiring pattern RDL2 may be located in or at the same level as that of the third dielectric layer 104. The second connection part RDL2-3 of the second wiring pattern RDL2 may have a width less than that of the second intervention part RDL2-2 of the second wiring pattern RDL2. For the second wiring pattern RDL2, the width of the second connection part RDL2-3 may be greater than that of the second penetration part RDL2-1.

The second conductive pattern 121 may be provided in the third dielectric layer 104. The second conductive pattern 121 may be provided in plural. The plurality of second conductive patterns 121 may be positioned between the second wiring patterns RDL2. The second conductive patterns 121 may have their top surfaces 121_T at the same level as that of a top surface RDL2-2_T of the second intervention part RDL2-2 of the second wiring pattern RDL2.

The first and second conductive patterns 111 and 121 may include a conductive material, for example, copper. The first conductive pattern 111 may be spaced apart from the first wiring pattern RDL1 to prevent an electrical connection. The second conductive pattern 121 may be spaced apart from the second wiring pattern RDL2 to prevent an electrical connection. No overlapping may be allowed between the conductive patterns 111 and 121 and the wiring patterns RDL1 and RDL2.

A distance between the top surface 111_T of the first conductive pattern 111 and the top surface 103_T of the second dielectric layer 103 may be an insulation distance sufficient enough to achieve no (i.e., prevent) electrical connection. The distance between the top surface 111_T of the first conductive pattern 111 and the top surface 103_T of the second dielectric layer 103 may be about 3 micrometers (μm) or less.

A distance between the top surface 121_T of the second conductive pattern 121 and a top surface 104_T of the third dielectric layer 104 may be an insulation distance sufficient enough to achieve no (i.e., prevent) electrical connection. The distance between the top surface 121_T of the second conductive pattern 121 and the top surface 104_T of the third dielectric layer 103 may be about 3 μm or less.

The third wiring pattern RDL3 may be provided in the third dielectric layer 104 and the fourth dielectric layer 105. The third wiring pattern RDL3 may be provided in plural. The third wiring pattern RDL3 may include a third penetration part RDL3-1 and a third intervention part RDL3-2 on the third penetration part RDL3-1. The third penetration part RDL3-1 and the third intervention part RDL3-2 may be connected to constitute a single unitary structure with no boundary therebetween.

The third penetration part RDL3-1 of the third wiring pattern RDL3 may be located in or at the same level as the third dielectric layer 104. The third penetration part RDL3-1 of the third wiring pattern RDL3 may penetrate the third dielectric layer 104. The third penetration part RDL3-1 may have an inclined sidewall RDL3-1_S. The third penetration part RDL3-1 may have a width that increases in a direction from bottom toward top surfaces of the third penetration part RDL3-1.

The third intervention part RDL3-2 of the third wiring pattern RDL3 may be located in or at the same level as that of the fourth dielectric layer 105. The third intervention part RDL3-2 of the third wiring pattern RDL3 may have a bottom surface at the same level as that of a bottom surface of the fourth dielectric layer 105. The third intervention part RDL3-2 may penetrate the fourth dielectric layer 105.

Only the third wiring pattern RDL3 may be provided on the fourth dielectric layer 105. No conductive pattern may be separately provided in the fourth dielectric layer 105 to prevent an electrical connection other than that through the third wiring pattern RDL3.

The first penetration part RDL1-1, the first intervention part RDL1-2, and the first connection part RDL1-3 of the first wiring pattern RDL1 may be continuously connected into a single unitary structure with no boundary therebetween. This may be true for the second wiring pattern RDL2. The third penetration part RDL3-1 and the third intervention part RDL3-2 of the third wiring pattern RDL3 may be continuously connected into a single unitary structure with no boundary therebetween.

The first wiring pattern RDL1, the second wiring pattern RDL2, and the third wiring pattern RDL3 may be electrically connected to each other.

As the interconnection structure 1 is provided with the first conductive pattern 111 and the second conductive pattern 121, the first, second, third, and fourth dielectric layers 102, 103, 104, and 105 may be prevented from shrinkage. The first, second, third, and fourth dielectric layers 102, 103, 104, and 105 may be free of undulation caused by shrinkage thereof. Accordingly, in consideration of controlling depth of exposure when an upper wiring pattern is formed, it may be possible to reduce or prevent a pattern delamination issue resulting from exposure deficiency when the upper wiring pattern is formed.

Because the first intervention part RDL1-2 is provided on the first penetration part RDL1-1 of the first wiring pattern RDL1, a sufficient insulation distance may be secured between the first conductive pattern 111 and the top surface 103_T of the second dielectric layer 103. As the first conductive pattern 111 and the first wiring pattern RDL1 are spaced apart from each other, and as a sufficient insulation distance is secured between the first conductive pattern 111 and the top surface 103_T of the second dielectric layer 103, it may be possible to prevent undesired electrical connections of the first conductive pattern 111. This may also apply for the second conductive pattern 121.

Figure 2B:
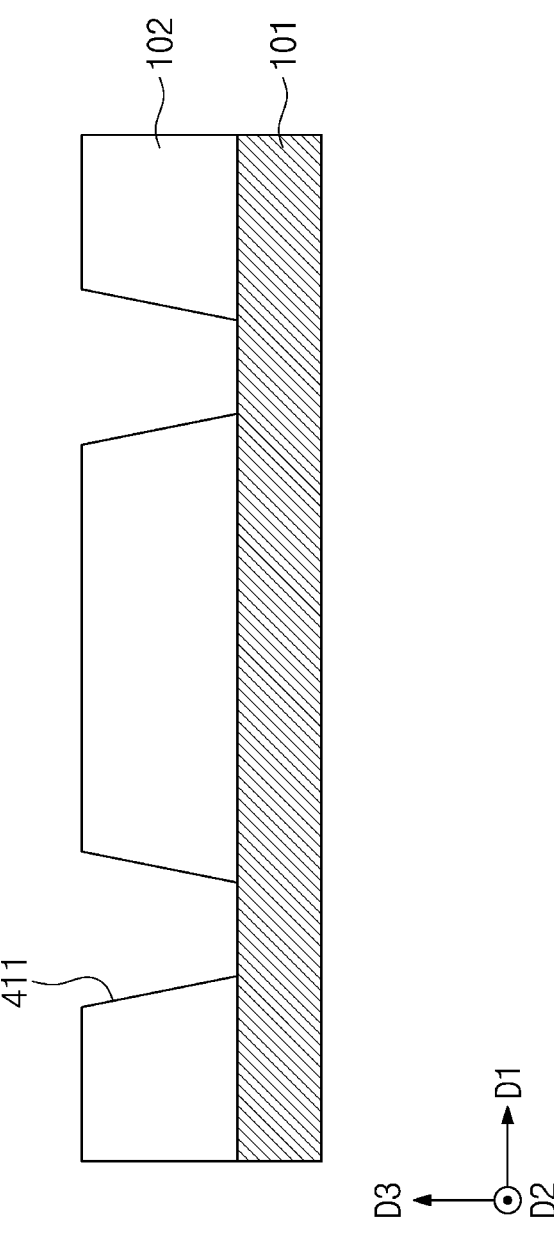
Figure 2C:
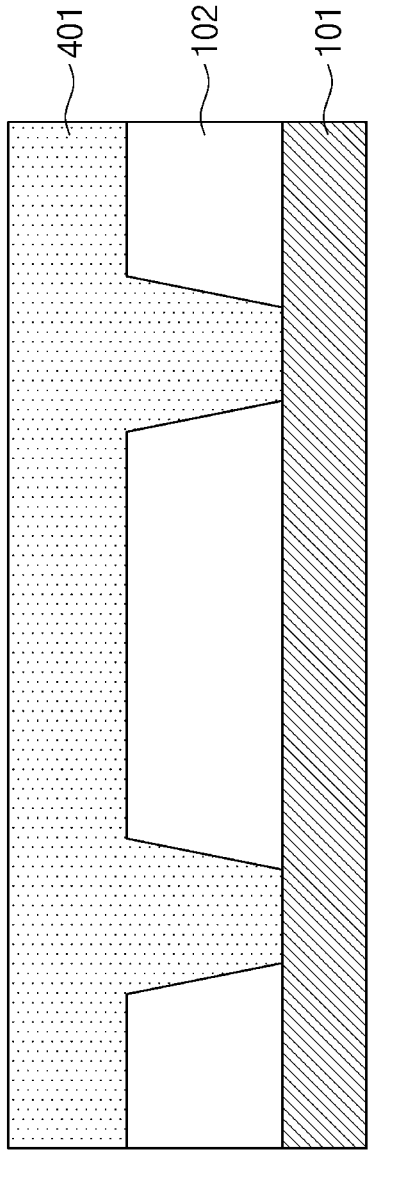
Figure 2D:
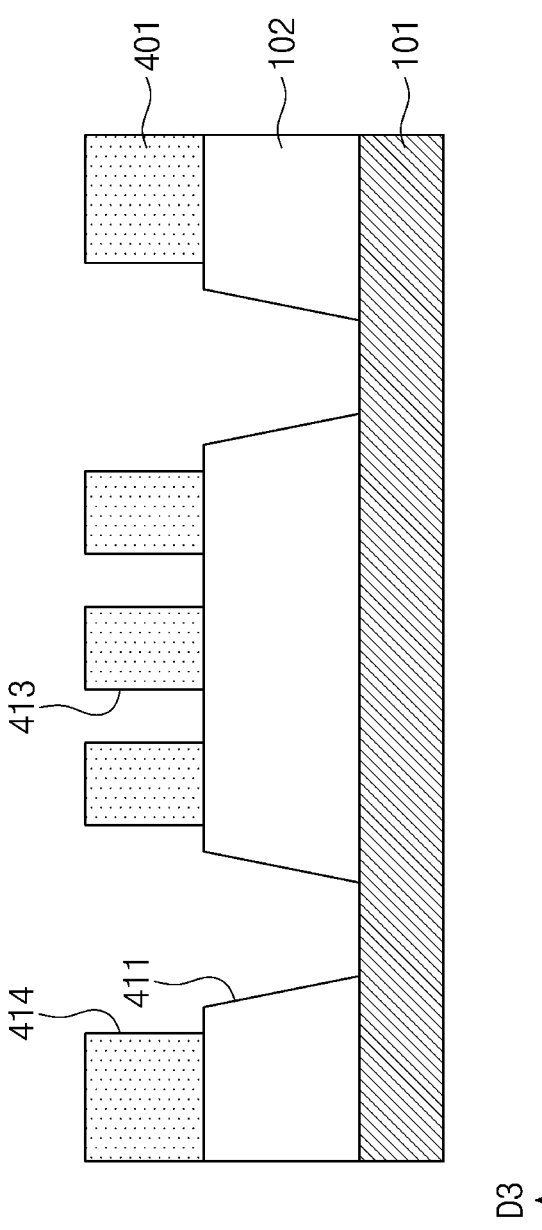
Figure 2D:
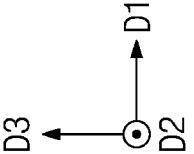
Figure 2E:
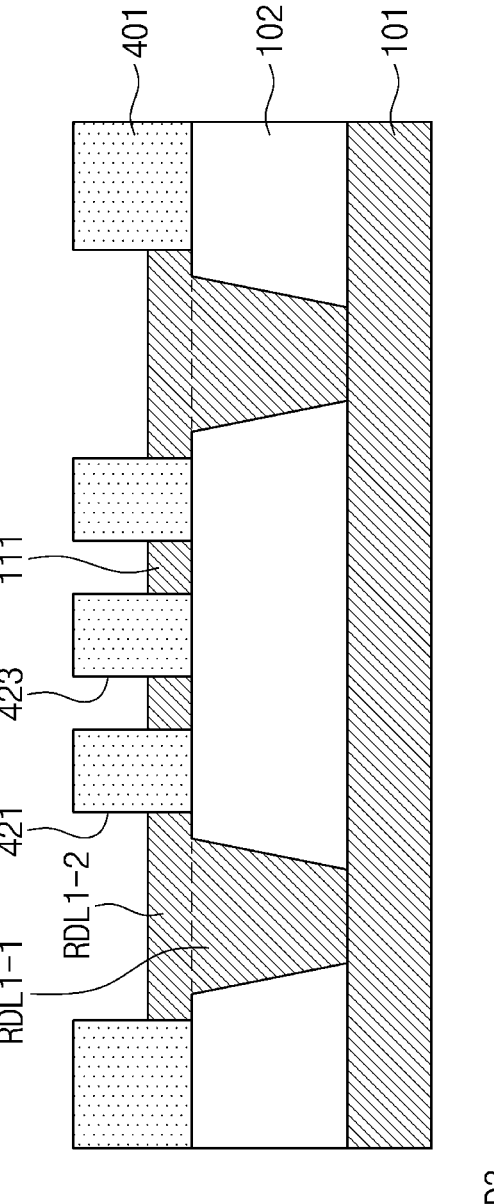
Figure 2F:
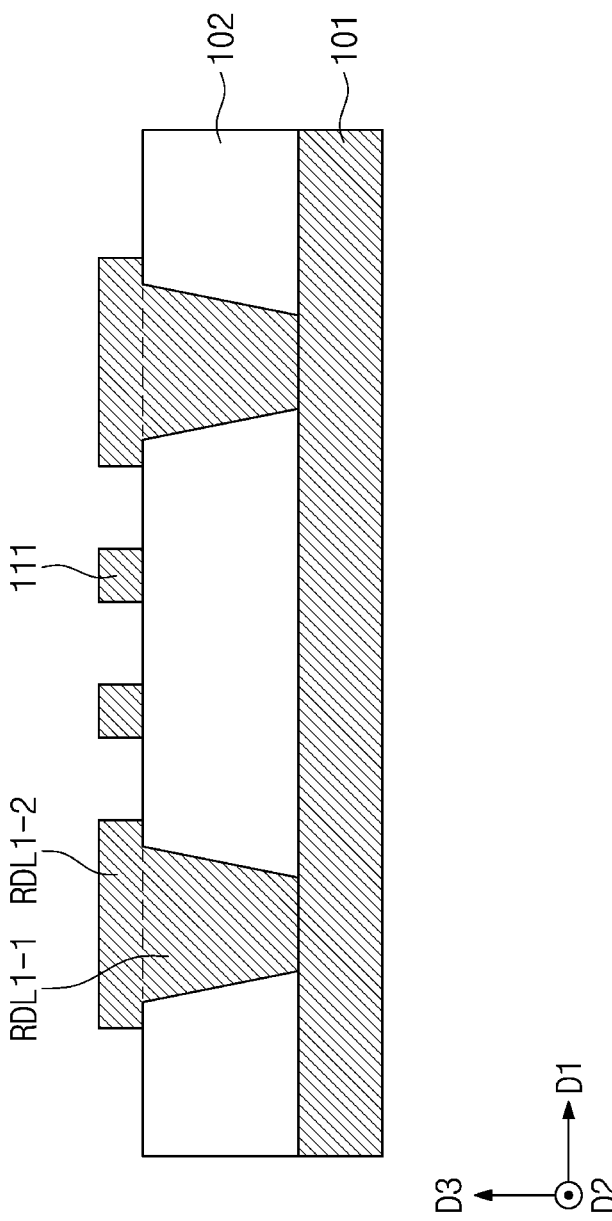
Figure 2G:
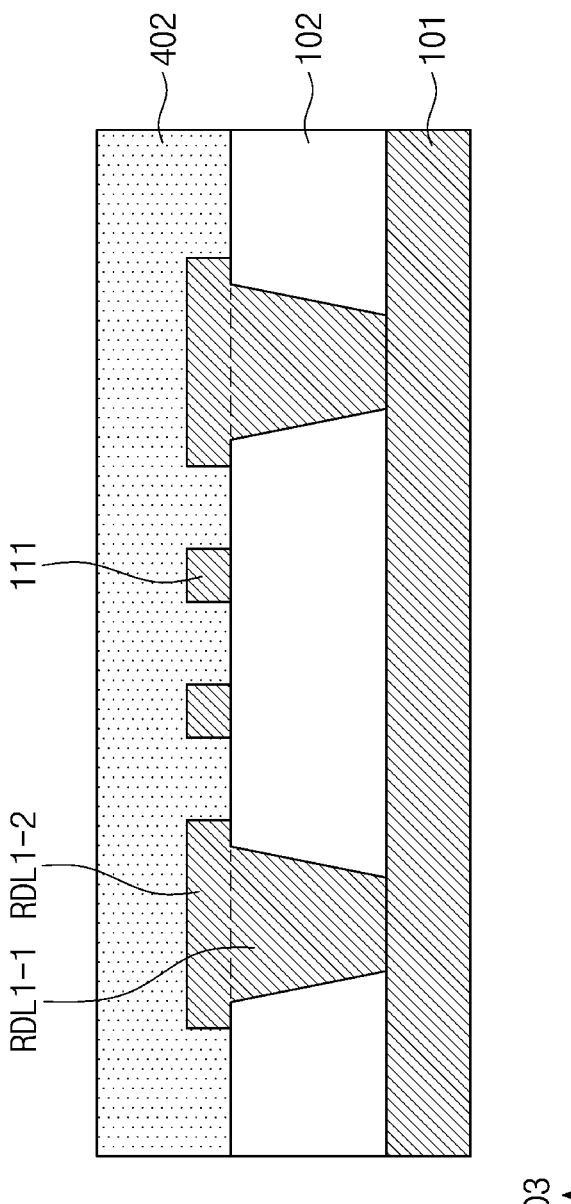
Figure 2G:
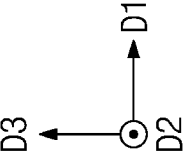
Figure 2H:
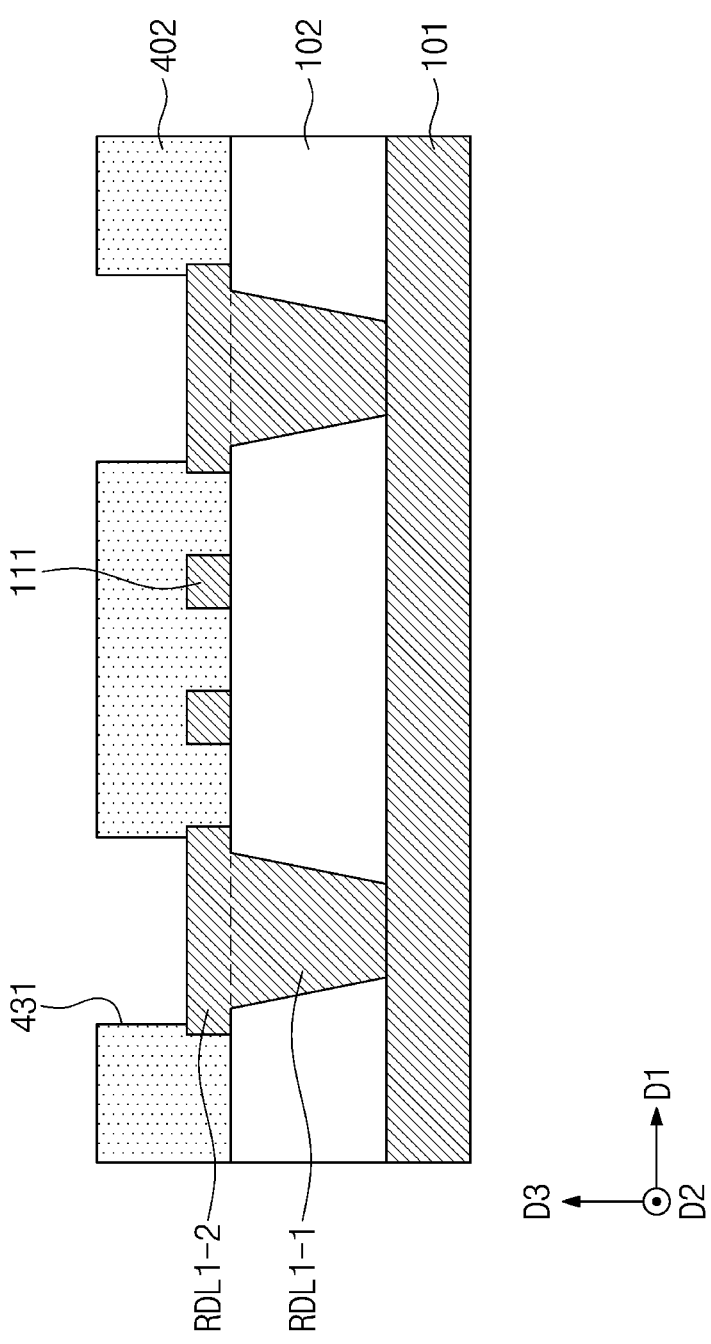
Figure 2I:
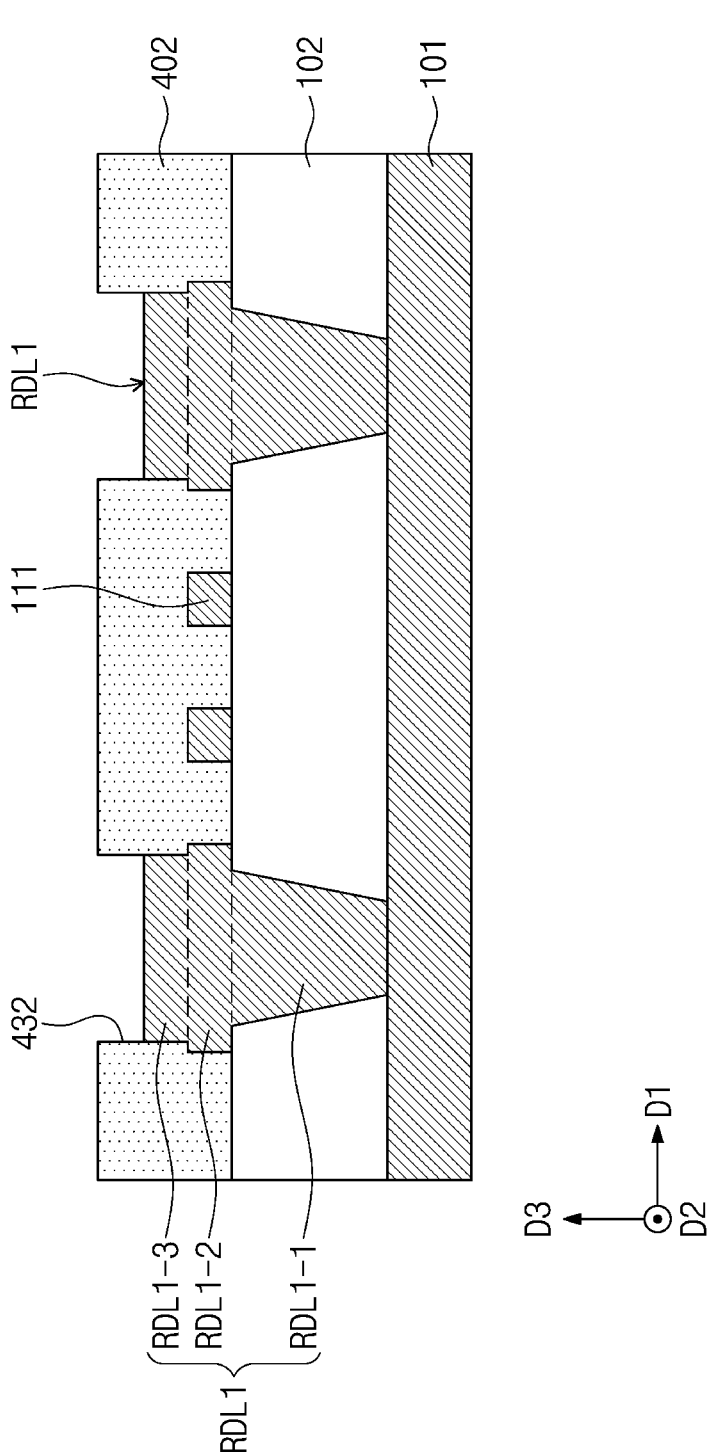
Figure 2J:
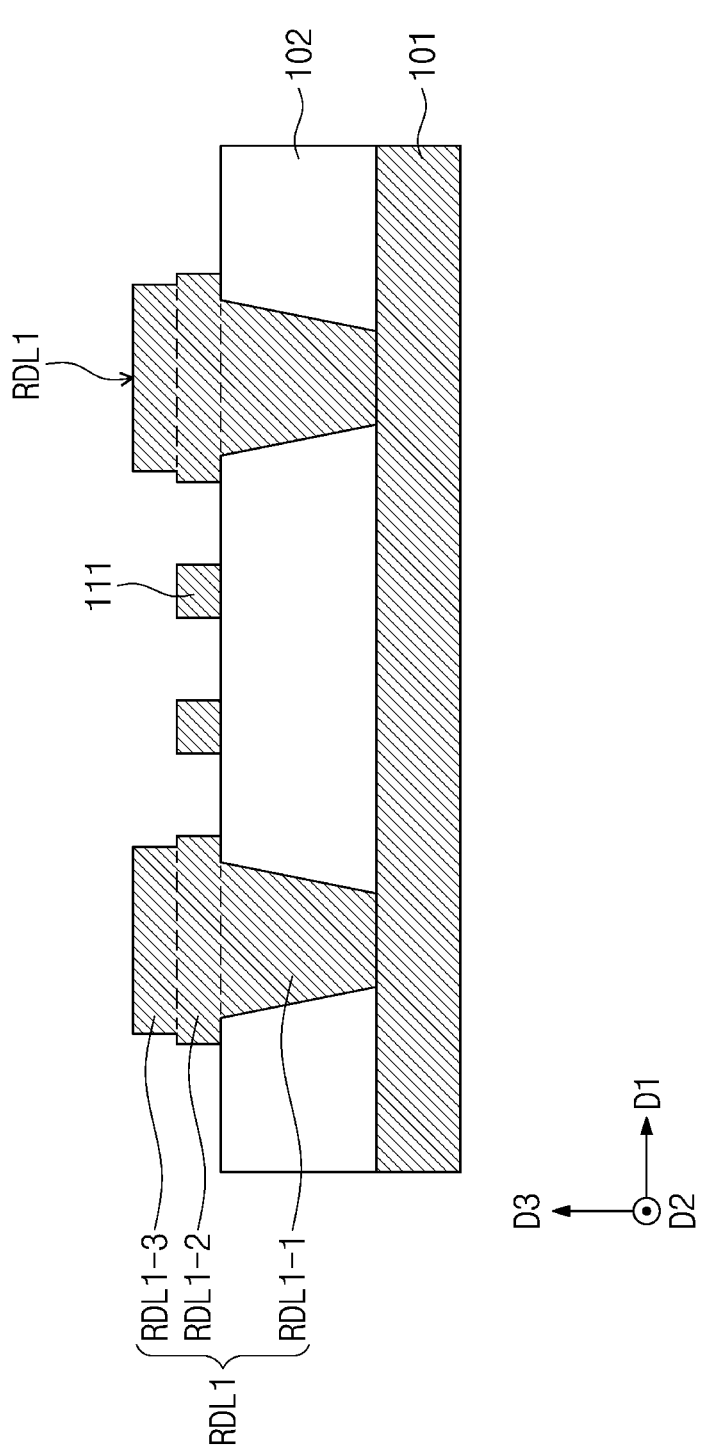
Figure 2K:
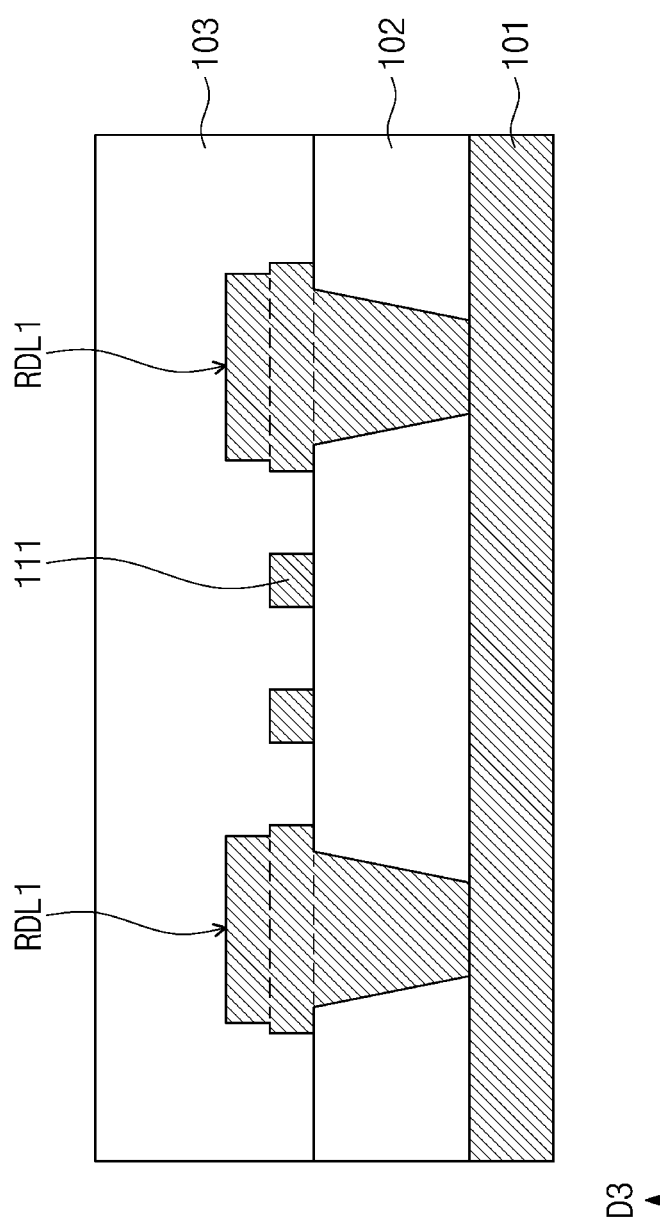
Figure 2L:
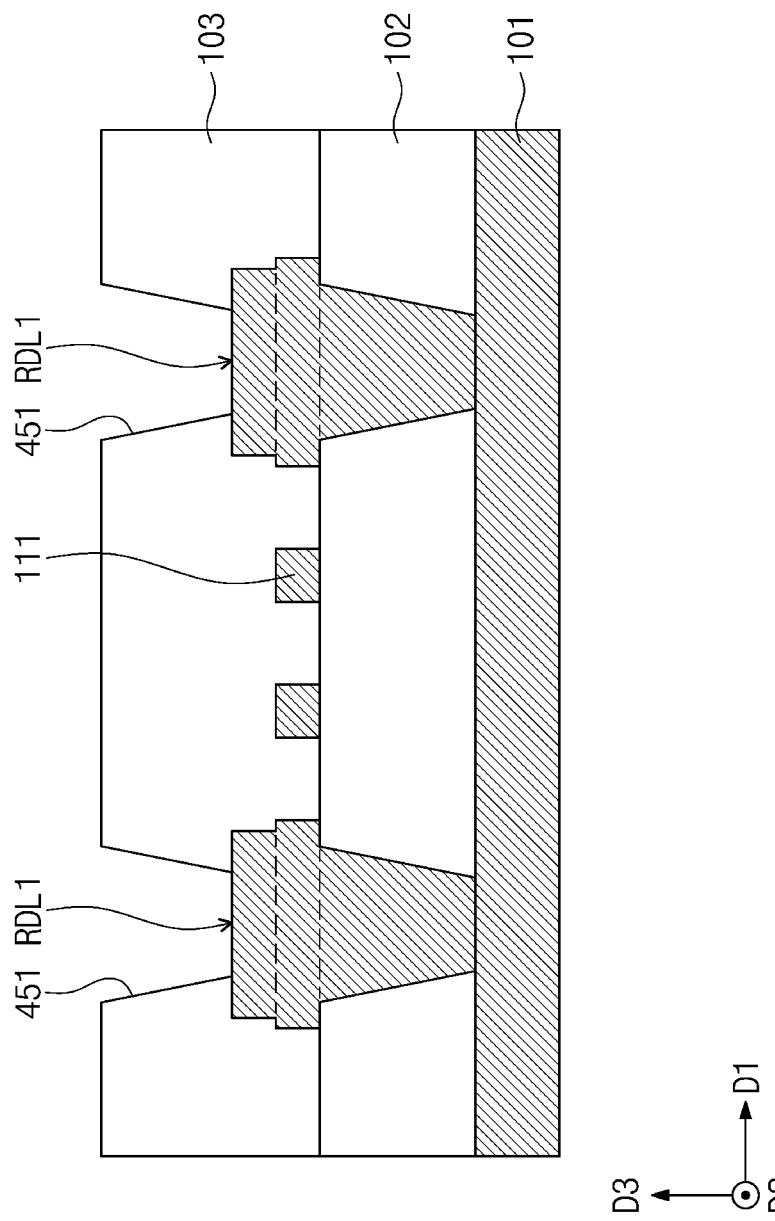
Figure 2M:
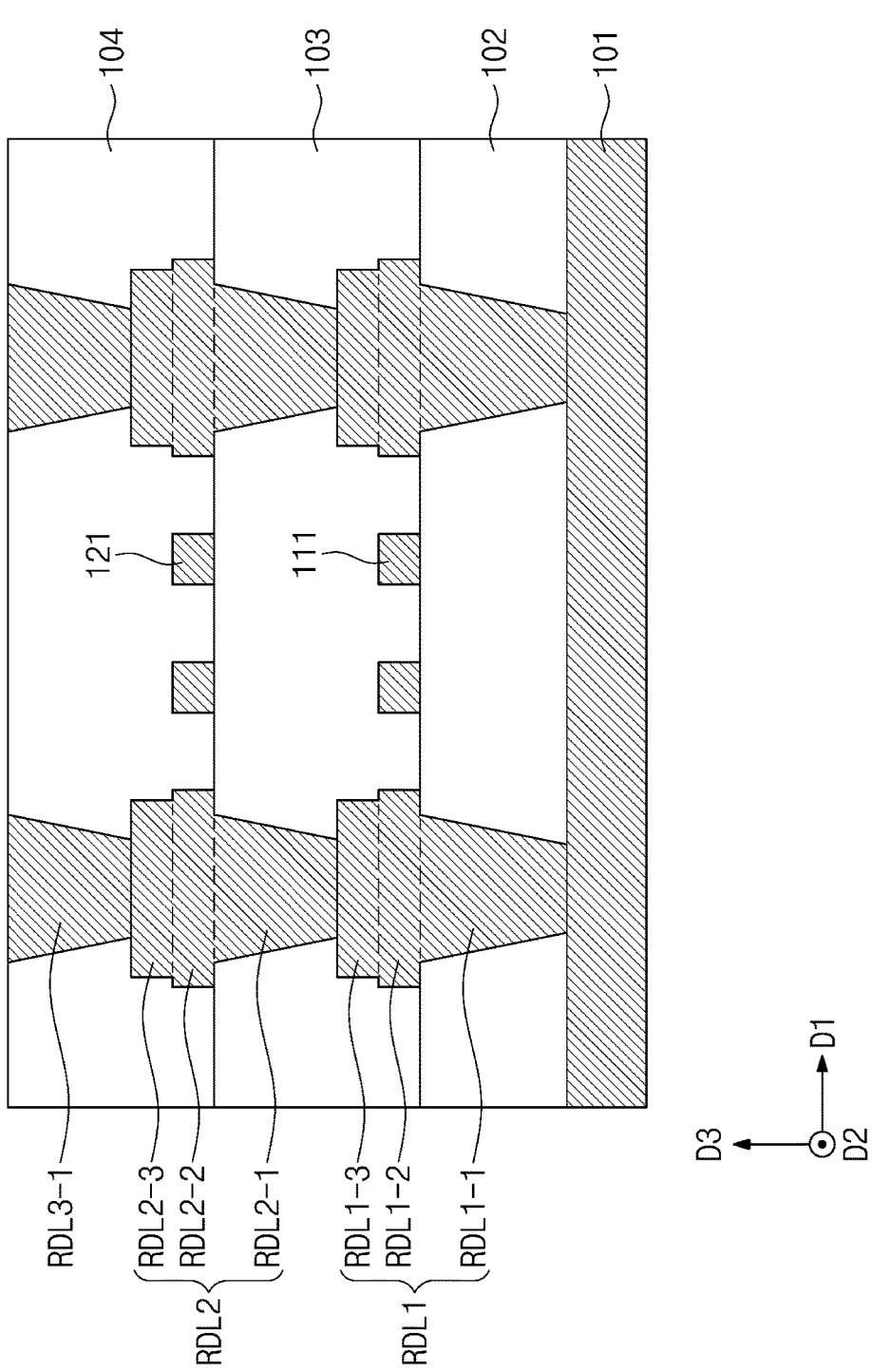
Figure 2N:
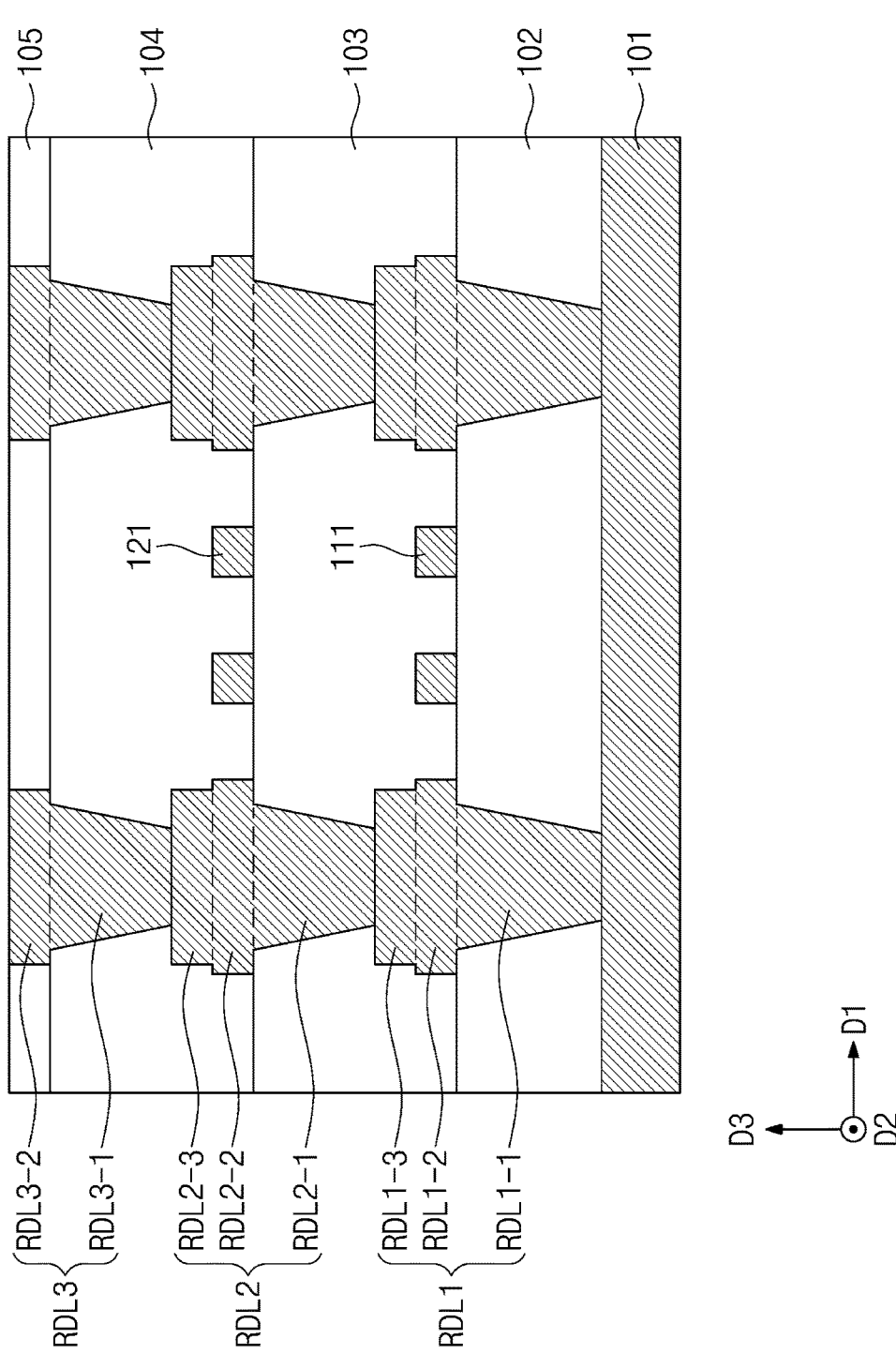

FIGS. 2A to 2N illustrate cross-sectional views showing a method of fabricating an interconnection structure according to some embodiments of the present inventive concepts.

Referring to FIG. 2A, there may be provided a seed layer 101 and a first dielectric layer 102 on the seed layer 101. The seed layer 101 and the first dielectric layer 102 may be stacked in a third direction D3. The seed layer 101 may include a conductive material. For example, the seed layer 101 may include copper. The seed layer 101 may include the same material as that of a first wiring pattern RDL1, a second wiring pattern RDL2, and a third wiring pattern RDL3 which will be discussed below.

Referring to FIG. 2B, the first dielectric layer 102 may be patterned to form a plurality of first via holes 411. The plurality of first via holes 411 may have respective inclined sidewalls. The first via holes 411 may partially expose the seed layer 101.

Referring to FIG. 2C, a first mask layer 401 may be provided on the seed layer 101 and the patterned first dielectric layer 102. The first mask layer 401 may include a photoresist. The first mask layer 401 may cover the exposed portions of the seed layer 101, the first via holes 411, and a top surface of the first dielectric layer 102.

Referring to FIG. 2D, the first mask layer 401 may be patterned to form a first conductive pattern hole 413 and a first wiring pad hole 414. The first mask layer 401 may be patterned by exposure and development processes. The patterning of the first mask layer 401 may expose the portions of the seed layer 101 and the sidewalls of the first via holes 411.

Referring to FIG. 2E, a conductive material may be used to cover the exposed portions of the seed layer 101, the first via holes 411, a portion of the first wiring pad hole 414, and a portion of the first conductive pattern hole 413.

As the first via holes 411 are filled with the conductive material, a first penetration part RDL1-1 may be formed. As the portion of the first wiring pad hole 414 is filled with the conductive material, a first intervention part RDL1-2 may be formed and an unoccupied portion of the first wiring pad hole 414 may be formed into a first wiring opening 421.

As the portion of the first conductive pattern hole 413 is filled with the conductive material, a first conductive pattern 111 may be formed and an unoccupied portion of the first conductive pattern hole 413 may be formed into a first conductive opening 423.

As discussed above, as the conductive material fills both the portion of the first wiring pad hole 414 and the portion of the first conductive pattern hole 413, the first penetration part RDL1-1 and the first conductive pattern 111 may have their top surfaces that are coplanar with each other.

Because the first mask layer 401 remains, the first mask layer 401 may cover a sidewall of the first intervention part RDL1-2 and a sidewall of the first conductive pattern 111.

Referring to FIG. 2F, the first mask layer 401 may be removed. The removal of the first mask layer 401 may expose the sidewall of the first intervention part RDL1-2 and the sidewall of the first conductive pattern 111. A portion of the first dielectric layer 102 may be exposed.

Referring to FIG. 2G, a second mask layer 402 may be provided on the first dielectric layer 102, the first intervention part RDL1-2, and the first conductive pattern 111. The second mask layer 402 may include a photoresist.

Referring to FIG. 2H, the second mask layer 402 may be patterned to form a second wiring pad hole 431. The second mask layer 402 may be patterned by exposure and development processes. The patterning of the second mask layer 402 may partially expose a top surface of the first intervention part RDL1-2.

Referring to FIG. 2I, a conductive material may be provided to cover the top surface of the first intervention part RDL1-2 and to fill a portion of the second wiring pad hole 431.

As the portion of the second wiring pad hole 431 is filled with the conductive material, a first connection part RDL1-3 may be formed. An unoccupied portion of the second wiring pad hole 431 may be formed into a second wiring opening 432.

The processes mentioned above may form a first wiring pattern RDL1 including the first penetration part RDL1-1, the first intervention part RDL1-2, and the first connection part RDL1-3.

Referring to FIG. 2J, the second mask layer 402 may be removed. The removal of the second mask layer 402 may expose the sidewall of the first intervention part RDL1-2 and a portion of the top surface of the first intervention part RDL1-2. The first connection part RDL1-3 may be exposed on its sidewall and top surface. The first conductive pattern 111 may be exposed on its sidewall and top surface.

Referring to FIG. 2K, a second dielectric layer 103 may be formed on the first dielectric layer 102 so as to cover the first wiring pattern RDL1 and the first conductive pattern 111. The second dielectric layer 103 may be formed to have a predetermined thickness or otherwise provide an insulation distance from the top surface of the first conductive pattern 111 so as to prevent an electrical connection of the first conductive pattern 111.

Referring to FIG. 2L, the second dielectric layer 103 may be patterned to form a plurality of second via holes 451. The plurality of second via holes 451 may have respective inclined sidewalls. The second via holes 451 may partially expose the top surface of the first connection part RDL1-3.

Referring to FIG. 2M, after the procedure of FIG. 2L, procedures similar to those of FIGS. 2C to 2L may be performed to form a third dielectric layer 104 on the second dielectric layer 103. In addition, a second wiring pattern RDL2 may be formed on the first wiring pattern RDL1, and a third penetration part RDL3-1 may be formed on the second wiring pattern RDL2.

Referring to FIG. 2N, a fourth dielectric layer 105 may be formed on the third dielectric layer 104. The fourth dielectric layer 105 may be patterned such that a third intervention part RDL3-2 may be formed to penetrate the fourth dielectric layer 105.

After the formation of the fourth dielectric layer 105 and the third intervention part RDL3-2, the seed layer 101 may be removed. After the removal of the seed layer 101, an interconnection structure 1 may be formed as illustrated in FIG. 1.

Figure 3:
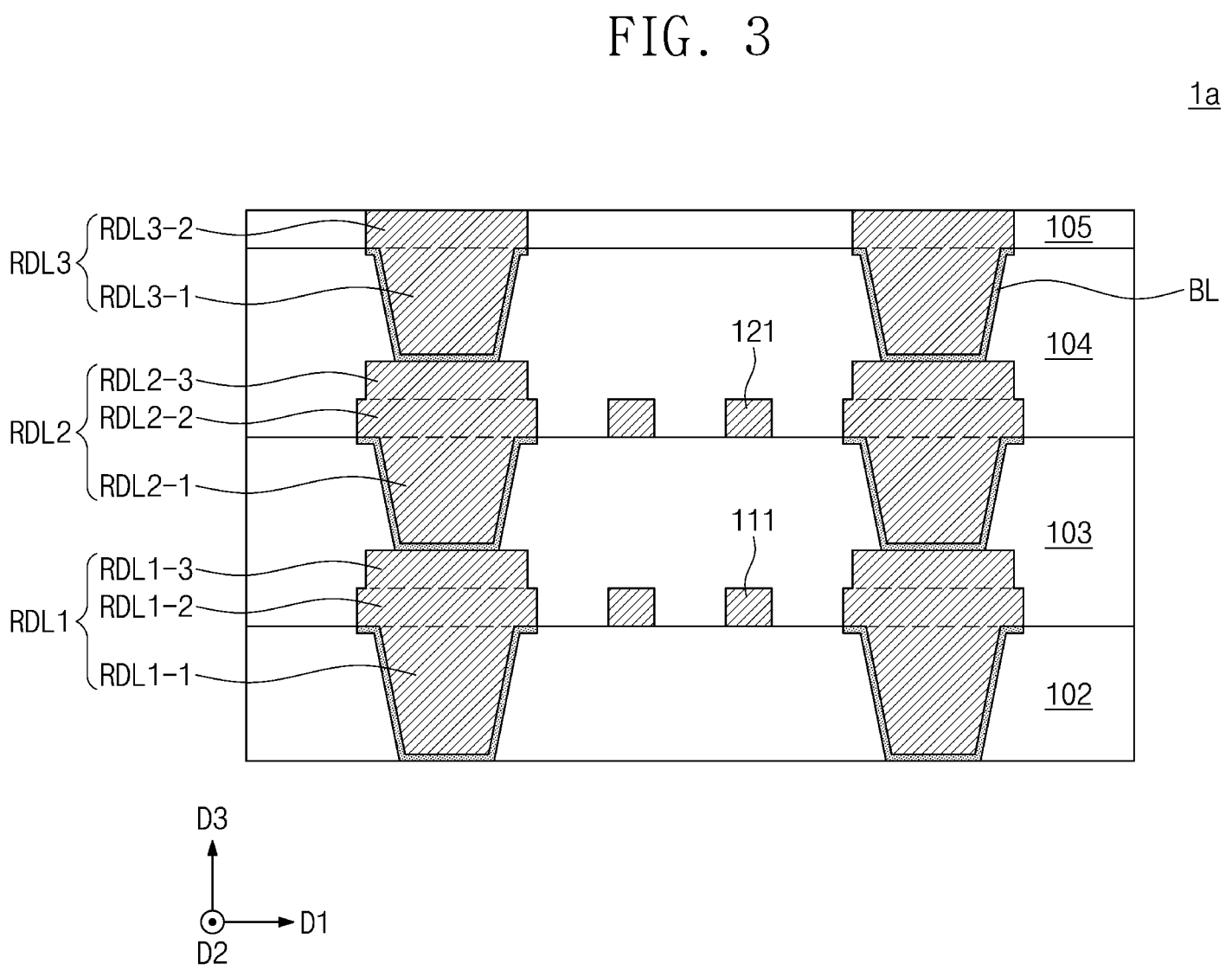

FIG. 3 illustrates a cross-sectional view showing an interconnection structure according to some embodiments of the present inventive concepts.

Referring to FIG. 3, an interconnection structure 1a may be provided which is similar to the interconnection structure 1 of FIG. 1. The interconnection structure 1a may include a barrier layer BL. The barrier layer BL may be interposed between the first dielectric layer 102 and the first wiring pattern RDL1. The barrier layer BL may be interposed between the second dielectric layer 103 and the second wiring pattern RDL2 and between the first wiring pattern RDL1 and the second wiring pattern RDL2. The barrier layer BL may be interposed between the third dielectric layer 104 and the third wiring pattern RDL3 and between the second wiring pattern RDL2 and the third wiring pattern RDL3. The barrier layer BL may include metal nitride, for example, at least one selected from titanium nitride (TiN), tantalum nitride (TaN), and tungsten nitride (WN). The barrier layer BL may divide the first connection part RDL1-3 of the first wiring pattern RDL1 from the second penetration part RDL2-1 of the second wiring pattern RDL2. The barrier layer BL may divide the second connection part RDL2-3 of the second wiring pattern RDL2 from the third penetration part RDL3-1 of the third wiring pattern RDL3.

Figure 4:
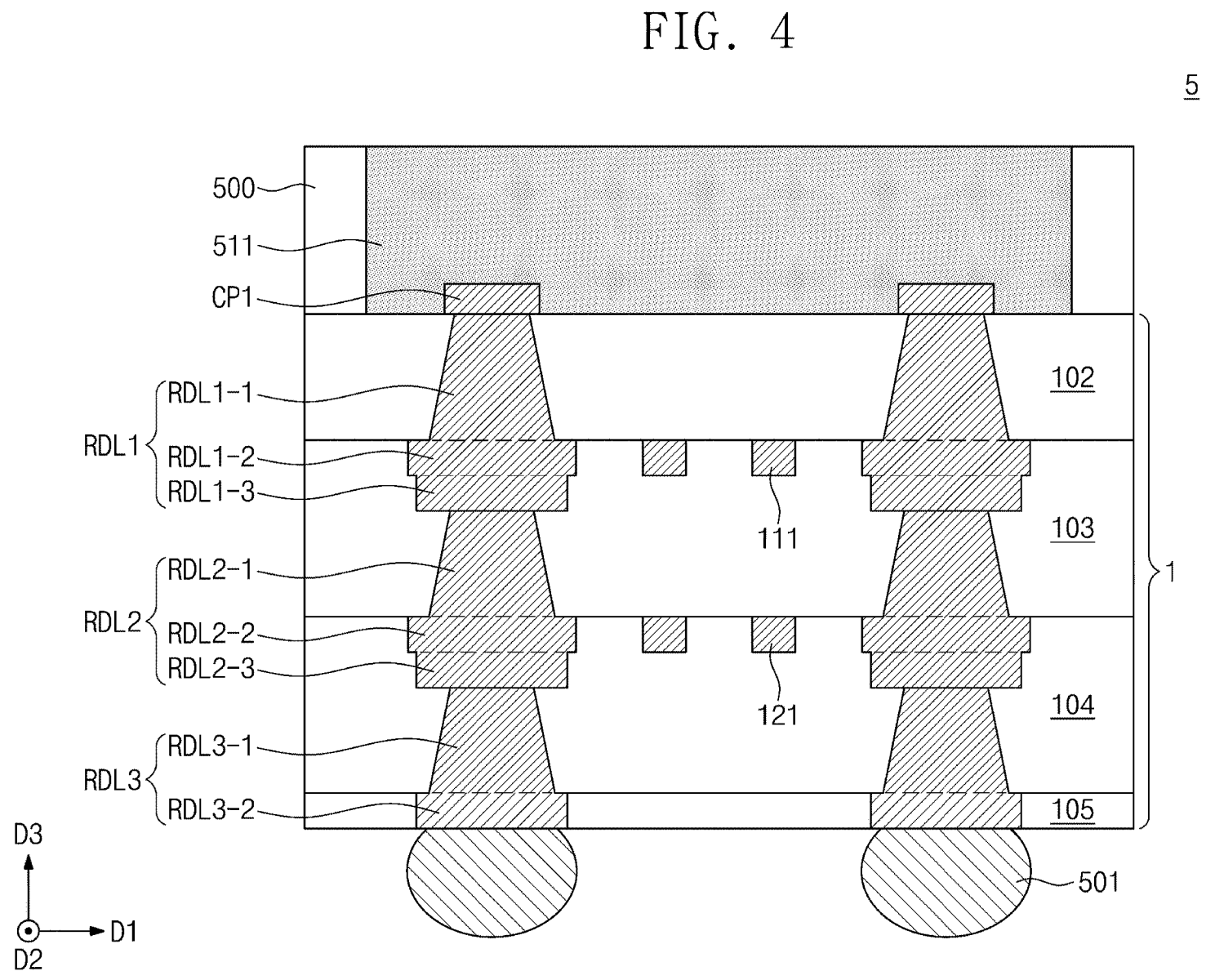

FIG. 4 illustrates a cross-sectional view showing a semiconductor package including an interconnection structure according to some embodiments of the present inventive concepts.

Referring to FIG. 4, a semiconductor package 5 may be provided to include the interconnection structure 1 that is upside side down relative to the position shown in FIG. 1. The semiconductor package 5 may include a solder ball 501, the interconnection structure 1 on the solder ball 501, a semiconductor chip 511 on the interconnection structure 1, and a molding layer 500.

The solder ball 501 may be electrically connected to the interconnection structure 1 that is disposed upside down. The solder ball 501 may be electrically connected to the third intervention part RDL3-2 of the third wiring pattern RDL3 in the interconnection structure 1.

The interconnection structure 1 may include the third wiring pattern RDL3, the second wiring pattern RDL2 on the third wiring pattern RDL3, and the first wiring pattern RDL1 on the second wiring pattern RDL2. A configuration of the interconnection structure 1 may be the same as that of the interconnection structure 1 of FIG. 1, except that the interconnection structure 1 of FIG. 1 is turned upside down.

The semiconductor chip 511 may be provided on the interconnection structure 1. The semiconductor chip 511 may include a connection pad CP1. The connection pad CP1 may include a conductive material. The semiconductor chip 511 may be electrically connected through the connection pad CP1 to the interconnection structure 1. The connection pad CP1 may be electrically connected to the first penetration part RDL1-1 of the first wiring pattern RDL1. A metal-to-metal bonding, such as a copper-to-copper (Cu—Cu) bonding, may be employed to accomplish an electrical connection between the connection pad CP1 and the first penetration part RDL1-1 of the first wiring pattern RDL1. The semiconductor chip 511 may have a width (e.g., along direction D1) less than that of each of the first, second, third, and fourth dielectric layers 102, 103, 104, and 105.

The molding layer 500 may be provided on the first dielectric layer 102. The molding layer 500 may surround the semiconductor chip 511.

In an embodiment, the semiconductor chip 511 may be a memory chip or a logic chip.

Figure 5:
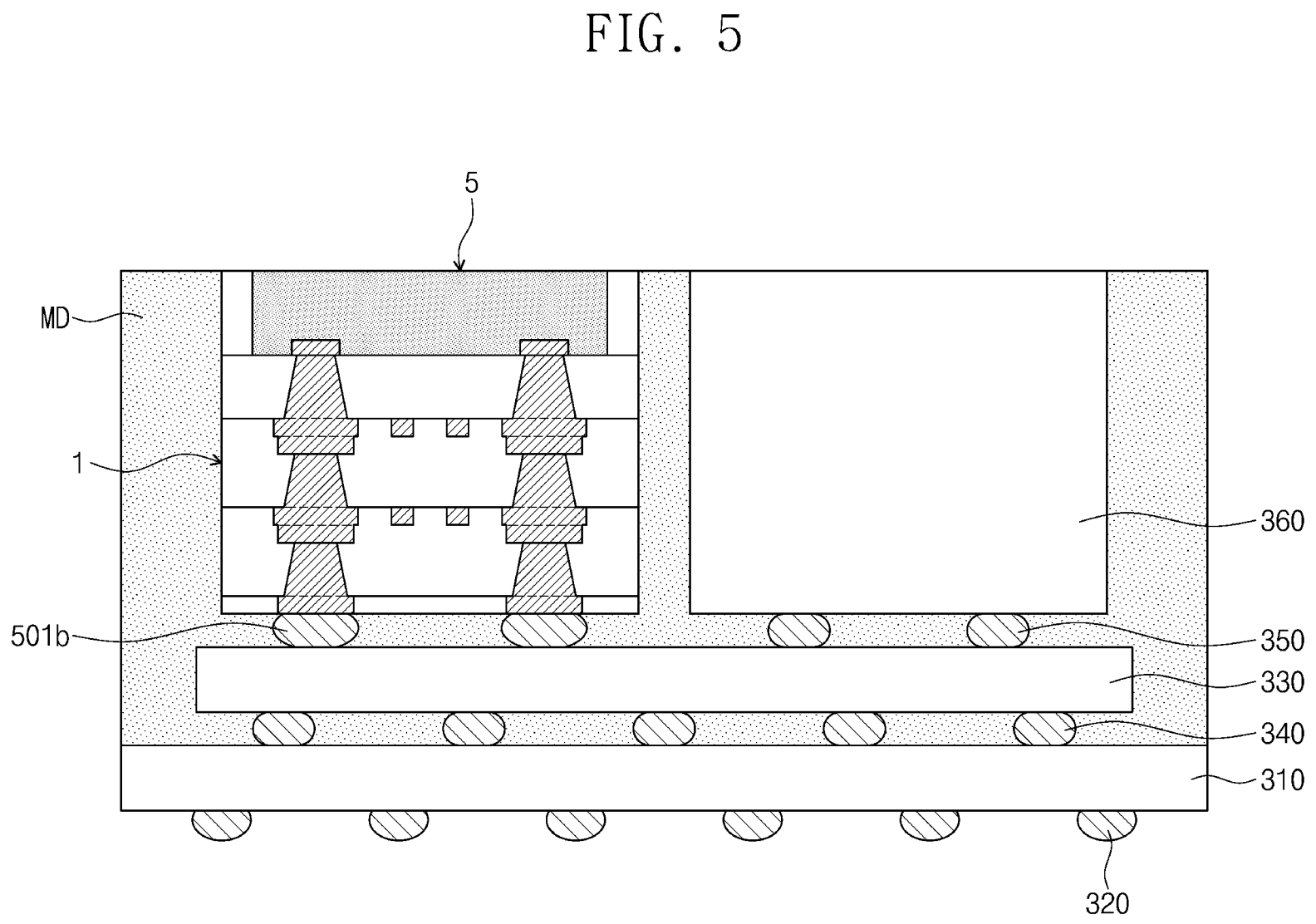

FIG. 5 illustrates a cross-sectional view showing a semiconductor package including an interconnection structure according to some embodiments of the present inventive concepts.

Referring to FIG. 5, a semiconductor package may include a package substrate 310.

First terminals 320 may be provided which are electrically connected to the package substrate 310. The semiconductor package may be mounted through the first terminals 320 to an external apparatus (e.g., a main board).

An interposer 330 may be provided on the package substrate 310. Second terminals 340 may be provided to electrically connect the package substrate 310 to the interposer 330. The second terminals 340 may be provided between the package substrate 310 and the interposer 330.

A processor chip 360 may be provided on the interposer 330. For example, the processor chip 360 may be a graphic processing unit (GPU) or a central processing unit (CPU). Third connection terminals 350 may be provided to electrically connect the processor chip 360 to the interposer 330. The third terminals 350 may be provided between the processor chip 360 and the interposer 330.

The interposer 330 may be provided thereon with a semiconductor package 5 including the interconnection structure 1 of FIG. 1. The semiconductor package 5 may be spaced apart in a first direction D1 from the processor chip 360. Solder balls 501b may be provided to electrically connect the semiconductor package 5 to the interposer 330.

The package substrate 310 may be provided thereon with a molding layer MD that surrounds the interposer 330, the processor chip 360, and the semiconductor package 5.

For an interconnection structure according to some embodiments of the present inventive concepts, before a wiring pattern is formed, a conductive pattern may be formed earlier to reduce or prevent shrinkage of dielectric layers, and undulation of the dielectric layers may be suppressed to reduce or prevent a pattern delamination issue caused by exposure deficiency when an upper wiring pattern is formed.

The various and useful advantages and effects of the present inventive concepts are not limited to above description, and can be more easily understood in the course of describing a specific embodiment of the present inventive concepts.

Although the present invention has been described in connection with the some example embodiments of the present inventive concepts illustrated in the accompanying drawings, it will be understood by one of ordinary skill in the art that variations in form and detail may be made therein without departing from the present inventive concepts. The above disclosed embodiments should thus be considered illustrative and not restrictive.

What is claimed is:

1. An interconnection structure, comprising:
a first dielectric layer;
a second dielectric layer on a surface of the first dielectric layer;
a plurality of first wiring patterns; and
a first conductive pattern between the first wiring patterns,
wherein the first wiring patterns respectively comprise:
a first penetration part that extends into the surface of the first dielectric layer;
a first intervention part on the first penetration part and in the second dielectric layer; and
a first connection part on the first intervention part and in the second dielectric layer,
wherein a top surface of the first intervention part is at a same level as a top surface of the first conductive pattern relative to the surface of the first dielectric layer, and
wherein an angle between a sidewall of the first connection part and the top surface of the first intervention part is greater than an angle between a sidewall of the first penetration part and a bottom surface of the first dielectric layer.

2. The interconnection structure of claim 1, wherein a width of the first connection part is greater than a width at a top surface of the first penetration part.

3. The interconnection structure of claim 2, wherein the angle between the sidewall of the first connection part and the top surface of the first intervention part is about 90 degrees.

4. The interconnection structure of claim 1, wherein
a width of the first penetration part increases in a direction from a bottom surface of the first penetration part toward a top surface of the first penetration part, and
a width of the first connection part is substantially uniform from a top surface of the first connection part to a bottom surface of the first connection part.

5. The interconnection structure of claim 1, further comprising:
a third dielectric layer on a surface of the second dielectric layer;
a fourth dielectric layer on the third dielectric layer;
a plurality of second wiring patterns on the first wiring patterns; and
a third wiring pattern on the second wiring pattern,
wherein the second wiring patterns respectively comprise:
a second penetration part that extends into the surface of the second dielectric layer;
a second intervention part on the second penetration part and in the third dielectric layer; and
a second connection part on the second intervention part and in the third dielectric layer.

6. The interconnection structure of claim 5, further comprising a plurality of second conductive patterns, wherein:
the second conductive patterns are between the second wiring patterns;

top surfaces of the second conductive patterns are at a same level as a top surface of the second intervention part; and the second conductive patterns do not overlap the first wiring patterns and/or the second wiring patterns.

7. The interconnection structure of claim 1, wherein the first dielectric layer and the second dielectric layer comprise a photo-imageable dielectric layer.

8. The interconnection structure of claim 1, wherein a distance between the top surface of the first conductive pattern and a top surface of the second dielectric layer is about 3 μm or less.

9. The interconnection structure of claim 1, wherein a distance between the top surface of the first conductive pattern and a top surface of the second dielectric layer is greater than a height of the first conductive pattern.

10. An interconnection structure, comprising:
a first dielectric layer;
a second dielectric layer on a surface of the first dielectric layer;
a plurality of first wiring patterns; and
a plurality of first conductive patterns between the first wiring patterns,
wherein the first wiring patterns respectively comprise:
a first penetration part that extends into the surface of the first dielectric layer;
a first intervention part on the first penetration part and in the second dielectric layer; and
a first connection part on the first intervention part and in the second dielectric layer,
wherein a width at a top surface of the first penetration part is different from a width at a bottom surface of the first penetration part, and
wherein a width at a top surface of the first connection part is the same as a width at a bottom surface of the first connection part.

11. The interconnection structure of claim 10, wherein a top surface of the first intervention part is at a same level as top surfaces of the first conductive patterns relative to the surface of the first dielectric layer.

12. The interconnection structure of claim 10, wherein the first conductive patterns comprise copper.

13. The interconnection structure of claim 10, wherein an angle between a sidewall of the first connection part and a top surface of the first intervention part is greater than an angle between a sidewall of the first penetration part and a bottom surface of the first dielectric layer.

14. The interconnection structure of claim 10, further comprising:
a third dielectric layer on a surface of the second dielectric layer;
a plurality of second wiring patterns on the first wiring patterns; and
a second conductive pattern between the second wiring patterns,
wherein the second wiring patterns respectively comprise:
a second penetration part that extends int the surface of the second dielectric layer;
a second intervention part on the second penetration part and in the third dielectric layer; and
a second connection part on the second intervention part and in the third dielectric layer, wherein a top surface of the second conductive pattern is at a same level as a top surface of the second intervention part, and wherein a width of the second connection part is less than a width of the second intervention part and greater than a width at a top surface of the second penetration part.

15. The interconnection structure of claim 14, wherein an angle between a sidewall of the first intervention part and a bottom surface of the second dielectric layer is the same as an angle between a sidewall of the first connection part and the top surface of the first intervention part.

16. The interconnection structure of claim 10, wherein the first dielectric layer comprises a photo-imageable dielectric layer.

17. The interconnection structure of claim 10, wherein a distance between top surfaces of the first conductive patterns and a top surface of the second dielectric layer is about 3 μm or less.

18. The interconnection structure of claim 10, wherein:
the plurality of first conductive patterns are spaced apart and electrically isolated from the first wiring patterns, and
the first penetration part, the first intervention part, and the first connection part comprise a unitary structure free of boundaries therebetween.

19. An interconnection structure, comprising:
a first dielectric layer;
a second dielectric layer on a surface of the first dielectric layer;
a third dielectric layer on the second dielectric layer;
a plurality of first wiring patterns;
a plurality of second wiring patterns on the first wiring patterns;
a plurality of first conductive patterns between the first wiring patterns; and
a plurality of second conductive patterns between the second wiring patterns,
wherein the first wiring patterns respectively comprise:
a first penetration part that extends into the surface of the first dielectric layer;
a first intervention part on the first penetration part and in the second dielectric layer; and
a first connection part on the first intervention part in the second dielectric layer,
wherein a top surface of the first intervention part is at a same level as top surfaces of the first conductive patterns relative to the surface of the first dielectric layer, and
wherein the first intervention part and the first connection part define a stepwise shape in which a sidewall of the first connection part extends from the top surface of the first intervention part to a top surface of the first connection part and in which a sidewall of the first intervention part is offset in a horizontal direction from the sidewall of the first connection part.

20. The interconnection structure of claim 19, wherein an angle between the sidewall of the first intervention part and a bottom surface of the second dielectric layer is the same as an angle between the sidewall of the first connection part and the top surface of the first intervention part.

* * * * *